United States Patent
Zhang et al.

(10) Patent No.: US 9,478,949 B2
(45) Date of Patent: Oct. 25, 2016

(54) FUSIBLE METER STACK APPARATUS, MULTI-UNIT POWER DISTRIBUTION APPARATUS, AND OPERATIONAL METHODS

(71) Applicant: Siemens Industry, Inc., Alpharetta, GA (US)

(72) Inventors: Fan Zhang, Suwanee, GA (US); Brian J. Rusch, Suwanee, GA (US); Arthur Kevin Shumate, Duluth, GA (US); Patricia Logsdon, Marietta, GA (US); Carey D. Harnois, Grayson, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 139 days.

(21) Appl. No.: 14/332,752

(22) Filed: Jul. 16, 2014

(65) Prior Publication Data
US 2016/0020584 A1    Jan. 21, 2016

(51) Int. Cl.
  *H02B 1/03* (2006.01)
  *H02B 1/20* (2006.01)
  *G01R 11/04* (2006.01)
  *H01H 85/56* (2006.01)

(52) U.S. Cl.
  CPC .................. *H02B 1/03* (2013.01); *G01R 11/04* (2013.01); *H02B 1/207* (2013.01); *H01H 85/56* (2013.01)

(58) Field of Classification Search
  None
  See application file for complete search history.

(56) References Cited

U.S. PATENT DOCUMENTS

| | | | | |
|---|---|---|---|---|
| 3,104,276 A | * | 9/1963 | Cataldo | H02G 5/007 174/88 B |
| 3,183,298 A | * | 5/1965 | Weimer | H01R 13/193 174/88 B |
| 4,118,754 A | | 10/1978 | Duggan | |
| 5,466,889 A | * | 11/1995 | Faulkner | H02G 5/007 174/133 B |
| 5,936,834 A | * | 8/1999 | Polston | H02B 1/20 361/660 |
| 7,400,495 B1 | * | 7/2008 | Ranta | G01R 11/24 361/660 |
| 7,796,375 B2 | * | 9/2010 | Zhang | H02B 1/03 361/657 |
| 8,243,423 B2 | * | 8/2012 | Ranta | G01R 11/02 361/660 |
| 8,730,651 B2 | * | 5/2014 | Rusch | H02B 1/21 361/627 |
| 2013/0258558 A1 | * | 10/2013 | Rusch | H02B 1/21 361/634 |
| 2014/0098470 A1 | * | 4/2014 | Robinson | H02B 1/03 361/644 |
| 2014/0099820 A1 | * | 4/2014 | Robinson | H02B 1/03 439/517 |

OTHER PUBLICATIONS

Fusible Pullouts: 600 Volt Maximum 30, 60, 100 & 200 Amp Class T Fuse; (2 pages).
Power Mod. Siemens Industry, Inc. SPEEDFAX 2011 Product Catalog; (6 pages).

* cited by examiner

*Primary Examiner* — Courtney Smith

(57) ABSTRACT

A fusible meter socket apparatus is disclosed. The meter stack apparatus includes an enclosure having a first and second side, a meter section including a stack of meter sockets configured to accept utility meters, a cross bus connection section including cross bus bars adapted to provide modular connection to other components, a pull-out fusible switch contained within the enclosure, riser bus bars coupled to a load side of the fusible switch and to a line side of the stack of meter sockets, and connect bus bars coupled to a line side of the fusible switch and to the cross bus bars. Electrical power distribution apparatus including the fusible meter socket apparatus, and methods of operating the fusible meter socket apparatus are disclosed, as are other aspects.

20 Claims, 12 Drawing Sheets

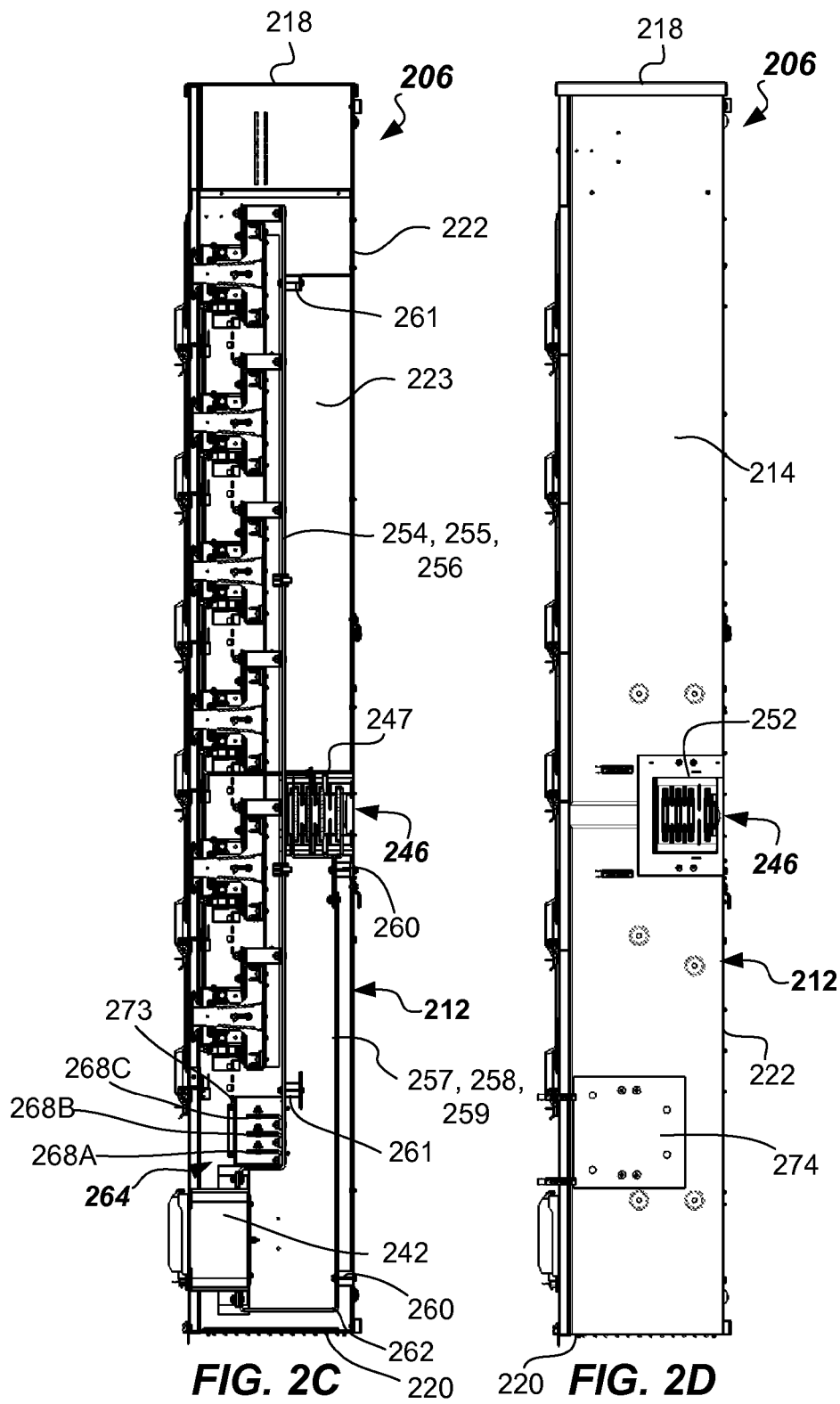

FUSIBLE METER STACK APPARATUS, MULTI-UNIT POWER DISTRIBUTION APPARATUS, AND OPERATIONAL METHODS

FIELD

The present invention relates generally to meter stack apparatus and methods and apparatus for electrical power distribution to multiple units.

BACKGROUND

Meter stacks include multiple meter sockets each configured to receive a utility meter. Such meter stacks are generally oriented so that the utility meters that are coupled thereto reside in a vertical column. Meter stacks may be used in multi-unit complexes (e.g., apartments, multi-unit office complexes, and the like) to distribute electrical power, and to allow for separate power consumption metering for each unit. Conventional meter stacks include about two to about six meter sockets, and may be coupled to a main panel box that receives power from a feeder line. The main panel box may include one or more main circuit breakers therein. One or more meter stacks may be electrically fed by the main panel box.

Because of the continual efforts to maximize living space in such multi-unit complexes, space for electrical power distribution components is very limited. Therefore, there is a need for improvements to multi-unit metering apparatus to further reduce space requirements thereof.

SUMMARY

According to a first aspect, a meter stack apparatus is provided. The meter stack apparatus includes an enclosure having a first side and a second side, a meter section including a stack of meter sockets configured to receive utility meters, a cross bus connection section including cross bus bars extending between the first side and the second side, and having one or more side openings configured allow electrical connection to the cross bus bars, a pull-out fusible switch contained within the enclosure, riser bus bars coupled to a load side of the pull-out fusible switch and coupled to a line side of the meter sockets, and connect bus bars coupled to a line side of the pull-out fusible switch and to the cross bus bars of the cross bus connection section.

According to another aspect, a multi-unit power distribution apparatus is provided. The multi-unit power distribution apparatus includes a meter stack apparatus including an enclosure having a first side and a second side, a meter section including a stack of meter sockets configured to receive utility meters, a cross bus connection section including cross bus bars extending between the first side and the second side, and having one or more side openings configured allow electrical connection to the cross bus bars, a pull-out fusible switch contained within the enclosure, riser bus bars coupled to a load side of the pull-out fusible switch and coupled to a line side of the meter sockets, and connect bus bars coupled to a line side of the pull-out fusible switch and to the cross bus bars of the cross bus connection section; an expansion meter stack including an expansion meter stack enclosure having a first mounting side and a second mounting side, an expansion meter section including a stack of expansion meter sockets configured to receive expansion utility meters, expansion riser bus bars coupled to a line side of the expansion meter sockets; and an interconnection bus connection coupling the riser bus bars and the expansion riser bus bars.

According to yet another aspect, a method of operating a meter stack apparatus is provided. The method includes providing a meter stack apparatus including an enclosure having a first side and a second side, a meter section including a stack of meter sockets and coupled utility meters, a cross bus connection section including cross bus bars, a pull-out fusible switch contained within the enclosure, riser bus bars coupled to a load side of the pull-out fusible switch and to a line side of the stack of meter sockets, and connect bus bars coupled to a line side of the pull-out fusible switch and to the cross bus bars, and disconnecting electrical power from the stack of meter sockets and coupled utility meters by one of: pulling out the pull-out fusible switch, or opening fuses in the pull-out fusible switch during an overload or electrical fault.

Still other aspects, features, and advantages of the present invention may be readily apparent from the following description by illustrating a number of example embodiments and implementations, including the best mode contemplated for carrying out the present invention. The present invention may also be capable of other and different embodiments, and its several details may be modified in various respects, all without departing from the substance and scope of the present invention. Accordingly, the drawings and descriptions are to be regarded as illustrative in nature, and not as restrictive. The drawings are not necessarily drawn to scale. The invention covers all modifications, equivalents, and alternatives falling within the substance and scope of the invention.

BRIEF DESCRIPTION OF DRAWINGS

FIG. 2C illustrates a cross-sectioned side view of a meter stack apparatus according to embodiments.

FIG. 2D illustrates a right side view of a meter stack apparatus according to embodiments.

DESCRIPTION

Reference will now be made in detail to the various embodiments of this disclosure, examples of which are illustrated in the accompanying drawings. Wherever possible, the same reference numbers will be used throughout the drawings to refer to the same or like parts.

Figure 1:
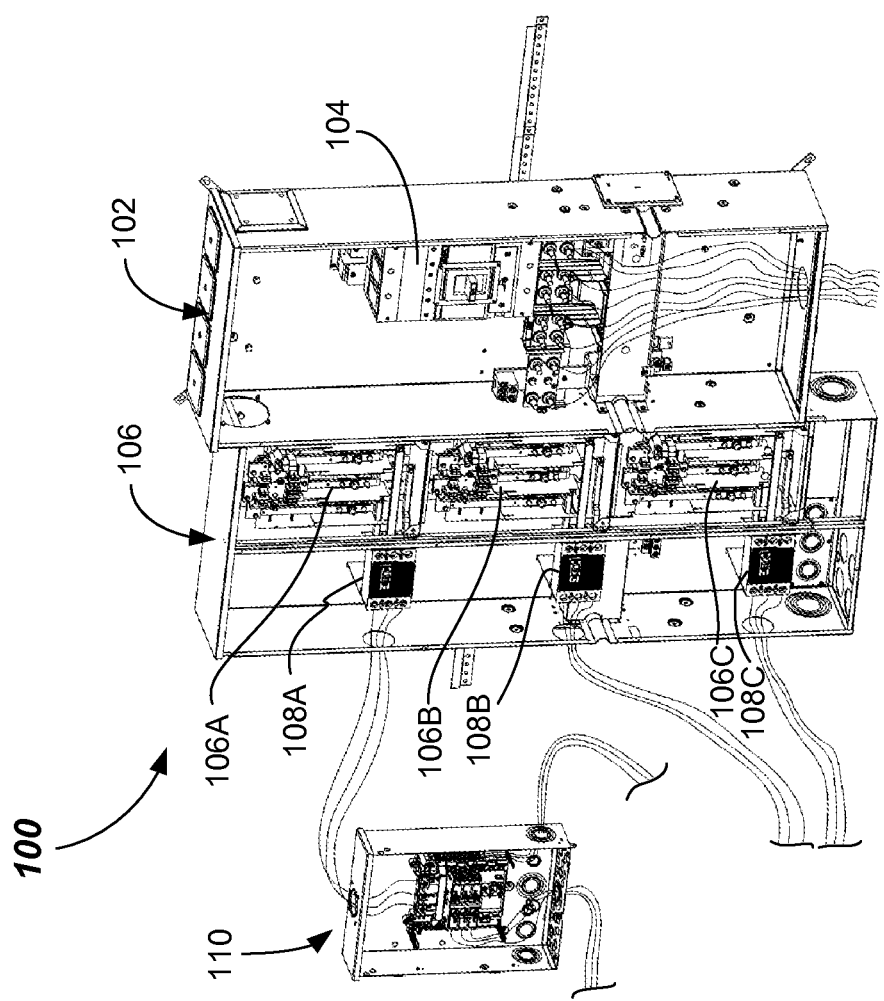
FIG. 1 illustrates a front perspective view of a multi-unit power distribution system including a meter stack apparatus according to the prior art.

Existing conventional electrical distribution systems 100, as shown in FIG. 1, for providing electrical power distribution to multiple dwelling units include a main panel box 102 as a main enclosure for housing a main service circuit breaker 104, a meter stack 106 coupled to the main panel box 102 and including individual meter sockets 106A, 106B, 106C that are coupled to circuit breakers 108A, 108B, 108C adapted to protect each individual unit of the multi-unit complex. Within the electrical distribution system 100, a breaker panel 110 may be provided for each unit (only one shown). Each breaker panel 110 may include branch circuit breakers adapted to protect individual branch circuits of the particular unit. However, such systems may tend to be bulky and complicated.

The aforementioned problems of electrical power distribution apparatus are overcome by embodiments of the present invention. In particular, the inventive meter stack apparatus includes an enclosure having a meter section including a plurality of meter sockets configured and adapted to receive multiple utility meters, a cross bus connection section having cross bus bars, riser bus bars and connect bus bars coupled to a line side of the meter sockets and the cross bus bars, respectively, and a pull-out fusible switch mounted to the riser bus bars and connect bus bars. The riser bus bars and connect bus bars may be A, B, and C phase bus bars for three phase operation, and A and B phase bus bars for single phase operation. The cross bus bars of the cross bus connection section may be A, B, and C phase cross bus bars and a neutral cross bus bar for three phase operation, and A and B phase cross bus bars and a neutral cross bus bar for single phase operation.

One or more embodiments allow electrical connection to a meter without any hard wiring and provide a fusible pull-out switch allowing protection of the meter stack within the enclosure. Additional embodiments of the invention provide a compact electric power distribution apparatus including a meter stack apparatus and an expansion meter stack apparatus with electrical connections to the expansion meter stack apparatus without using external wiring, conduits, and such labor required to install conventional configurations.

The invention will be explained in greater detail with reference to FIGS. 2A-6 below.

FIGS. 2A-2F illustrates an embodiment of a meter stack apparatus 206 that may be used within an electrical power distribution apparatus and system for a multi-unit complex (e.g. apartment building, multi-unit office park, or the like). The meter stack apparatus 206 may include an enclosure 212 (e.g., a metal box) that may be generally rectangular and may include a first side 214 and a second side 216, a top side 218 and bottom side 220, and a back side 222. Enclosure 212 may include an internal wall 223 dividing an internal cavity of the enclosure 212 into a tenant section 224 and a meter section 226 (See FIG. 2B).

A stack of meter sockets 228A-228F (e.g., a vertical column of meter sockets 228A-228F) may be included in the meter section 226. Meter sockets 228A-228F may be of conventional construction and are configured and adapted to accept/receive conventional utility meters (not shown). The meter sockets 228A-228F may include plug-on type sockets, as is conventional. Other types of meter sockets 228A-228F may be used, such as lever bypass type meter sockets, or the like. Base pans 230A-230F may be included in the tenant section 224. Base pans 230A-230F may be configured to electrically connect to the respective load sides of the meter sockets 228A-228F and accept/receive tenant circuit breakers 232A-232F, such as about 50 A to 225 A two-pole circuit breakers therein, for example. Tenant circuit breakers 232A-232F function to protect the meter sockets 228A-228F and connected units from undesirable current transients.

Enclosure 212 may include a series of suitable covers. For example, enclosure 212 may include an upper cover 234 configured to cover a portion of a top exit space 236. Top exit space 236 may be adapted to receive conduits through knock outs therein. A tenant cover 238, which may be removable, may be configured and adapted to cover the tenant section 224 used to house the tenant circuit breakers 232A-232F and associated wiring. Wiring may exit the top side 218, bottom side 220, or optionally through knock outs provided in the second side 216, for example, when no other component is coupled on that side. A lower cover 240 may be included on the front as part of the enclosure 212 and may provide access to a pull-out fusible switch 242, to be described in more detail later herein. The lower cover 240 may include a flip-up cover 240C providing direct access to the pull-out fusible switch 242. Meter covers 244A-244F may be provided, and each may include a meter opening adapted to receive a portion of the utility meters 243 (See FIG. 2A) there through so as to allow the utility meters 243 to be viewed without removing the meter covers 244A-244F. The enclosure components may be manufactured from bent rigid sheet material, such as sheet steel. Each of the tenant cover 238, lower cover 240, and meter covers 244A-244F may be lockable via a conventional locking tang and locking wire or lock.

The enclosure sides, back and covers (e.g., first side 214, second side 216, top side 218, bottom side 220, back side 222, and covers (e.g., upper cover 234, tenant cover 238, lower cover 240, and meter covers 244A-244F) may form the internal cavity of the enclosure 212 containing the components of the meter stack apparatus 206. Although, in the depicted embodiment, the tenant section 224 is shown on the left, the orientation of the tenant section 224 and meter section 226 may be reversed in some embodiments.

Within the enclosure 212, a cross bus connection section 246 may be provided. Cross bus connection section 246 may be part of a bus and switch assembly 245 to be described more thoroughly below. Cross bus connection section 246, as best shown in FIGS. 2E and 2F, provides the ability to readily pass electrical power from one side (e.g., the first side 214) of the enclosure 212 to another (e.g., the second side 216) so that other electrical modules (e.g., tap box) may electrically connect thereto. Cross bus connection section 246 may include A, B, and C phase cross bus bars in some embodiments (248—A phase cross bus bar; 249—B phase cross bus bar; 250—C phase cross bus bar; and a neutral cross bus bar 251) extending between the first side 214 and the second side 216. Neutral cross bus bar 251 may include a neutral connection tab 251C. Cross bus connection section 246 may include one or more side openings 252 as shown in FIG. 2D configured to allow electrical connection to the A, B, and C phase cross bus bars 248, 249, 250, respectively, and the neutral cross bus bar 251. An identical opening 252 as is shown on the first side 214 may be provided on the second side 216. The cross bus connection section 246 may include insulator ends 253E that mount to the enclosure 212 and insulate the respective A, B, and C phase cross bus bars 248, 249, 250 and neutral cross bus bar 251. A three phase installation is shown. However, it should be recognized that a single phase embodiment may be used wherein the cross bus connection section 246 may include only an A, and B phase cross bus bars 248, 249, and neutral cross bus bar 251.

Figures 2A, 2B:
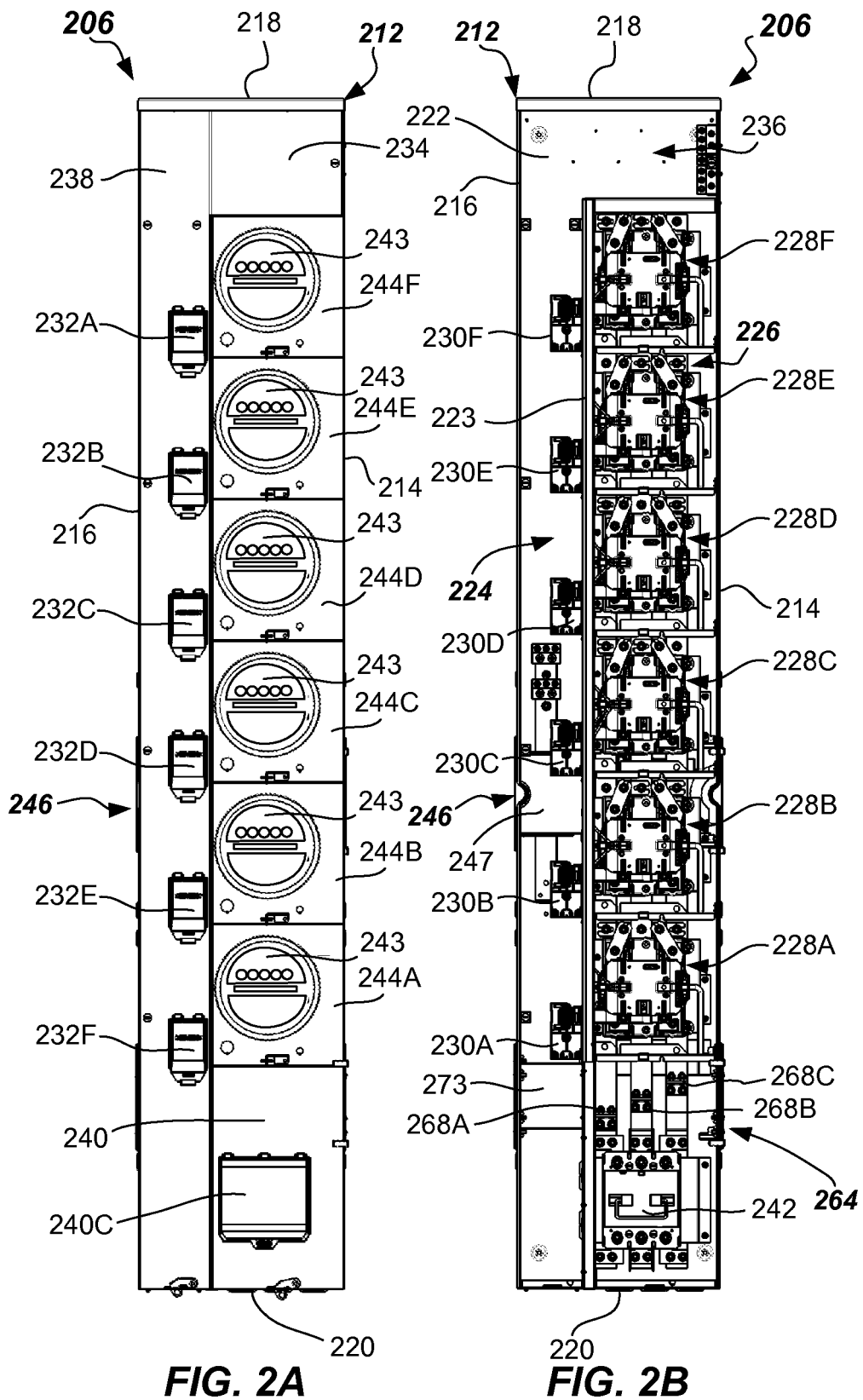
FIG. 2A illustrates a front plan view of a meter stack apparatus according to embodiments.
FIG. 2B illustrates a front plan view of a meter stack apparatus with the front covers removed according to embodiments.
Figure 2E:
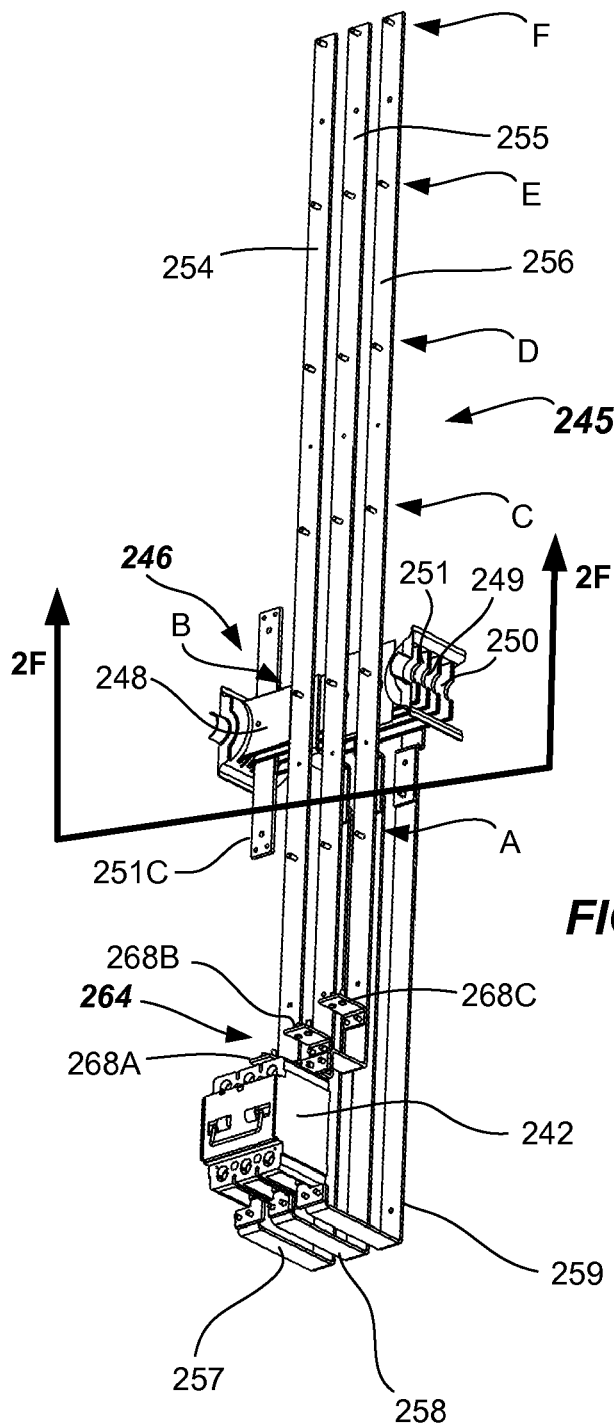
FIG. 2E illustrates a perspective view of a bus and switch assembly of a meter stack apparatus according to embodiments.
Figure 2F:
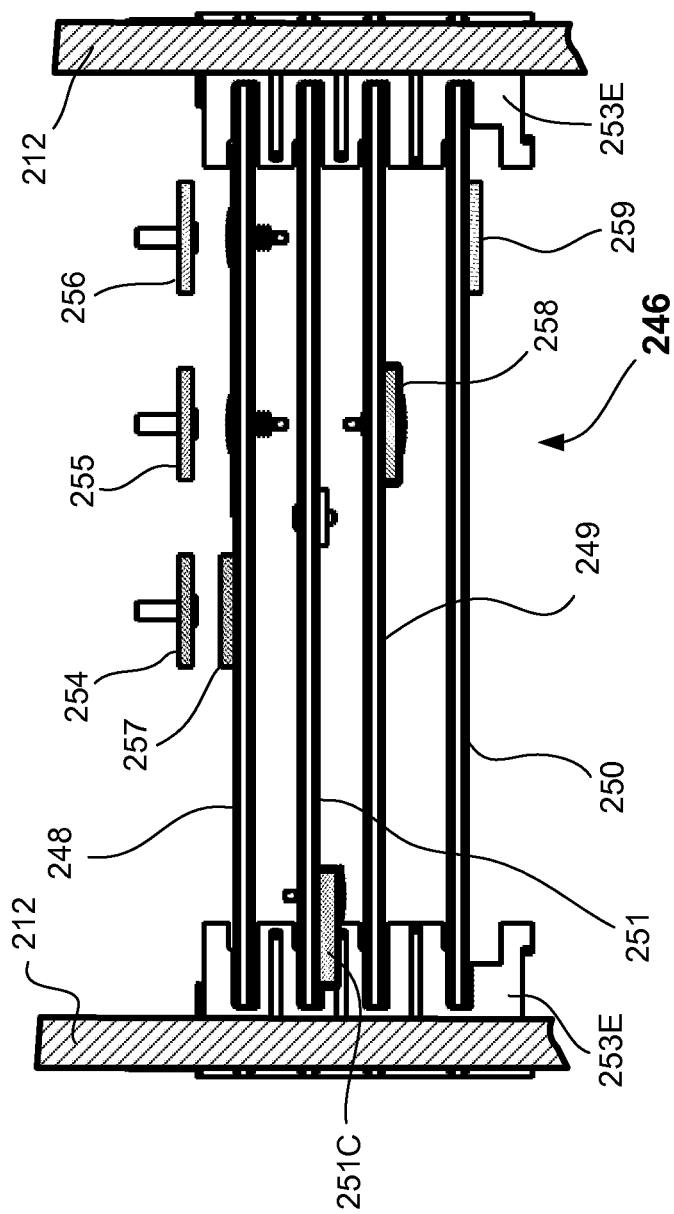
FIG. 2F illustrates a partial side view of electrical connections to the A, B, and C phase cross bus bars according to embodiments.

The cross bus connection section 246 shown extends laterally from the first side 214 to the second side 216 and may include an internal channel formed by a cross bus housing 247 into which the A, B, and C phase cross bus bars 248, 249, 250, respectively, and the neutral cross bus bar 251 may extend (See FIGS. 2B-2C). The cross bus housing 247 may be provided through at least the tenant section 224. A cross bus housing 247 of the cross bus connection section 246 is configured to at least partially surround the A, B, and C phase cross bus bars 248, 249, 250, respectively, and the neutral cross bus bar 251 within an internal channel in the tenant section 224.

Cross bus housing 247 may be secured to the back side 222 and/or second side 216 and/or internal wall 223 of the enclosure 212 by suitable fasteners (e.g., screws) such that the A, B, and C phase cross bus bars 248, 249, 250, respectively, and the neutral cross bus bar 251 are surrounded along a portion of their length by a housing structure. A, B, and C phase cross bus bars 248, 249, 250, respectively, are conductive bars adapted to carry electricity (e.g., A, B, and/or C phases of electricity). The neutral cross bus bar 251 may function as an electrical neutral. The A, B, and C phase cross bus bars 248, 249, 250 may have bar shape having a vertical thickness greater than a lateral width, and a length extending from side to side that is longer than both the width and thickness. The A, B, and C phase cross bus bars 248, 249, 250 may be constructed from a conductive metal material (e.g., copper or aluminum) and may be received in the one or more insulator ends 253E that are retained by the enclosure 212 (see FIG. 2F). In some embodiments, at least two spaced insulator ends 253E are used.

Removable side covers, such as rectangular plates (not shown), may be secured over the openings 252 that are unused. The removable side covers on one or more of the first side 214 and the second side 216 may be removable and configured to provide access into the internal channel of the cross bus connection section 246. This may allow connection to a tap box, an expansion meter stack apparatus 306, or the like.

The bus and switch assembly 245 adapted for three phase power also includes A, B, and C phase riser bus bars 254, 255, 256, respectively, and A, B, and C phase connect bus bars 257, 258, 259, respectively. The A, B, and C phase riser bus bars 254, 255, 256 are configured to couple to a load side of the pull-out fusible switch 242 and are also configured to couple to a line side of the meter sockets 228A-228F. In the depicted embodiment, the A, B, and C phase riser bus bars 254, 255, 256 include connections to the meter sockets 228A-F at six locations A-F along their length. The cross bus connection section 246 is located between a back side 222 of the enclosure 212 and the A, B and C phase riser bus bars 254, 255, 256.

The A, B, and C phase connect bus bars 257, 258, 259 couple to a line side of the pull-out fusible switch 242 (FIG. 2E) and also to the A, B, C phase cross bus bars 248, 249, 250 of the cross bus connection section 246 as shown in FIG. 2F. The A, B, and C phase riser bus bars 254, 255, 256, the A, B, and C phase connect bus bars 257, 258, 259, and the A, B, C phase cross bus bars 248, 249, 250 may be constructed of a copper or aluminum material, such as a strap or bar material. In the depicted embodiment, each of the A, B, and C phase connect bus bars 257, 258, 259 may be supported by and insulated from the enclosure 212 by one or more insulators 260. Insulators 260 may be plastic hex-shaped members, for example, and may attach to the enclosure 212 and the respective A, B, and C phase connect bus bars 257, 258, 259. The A, B, and C phase connect bus bars 257, 258, 259 may have a lower portion that includes bends to form a j-shaped section 262 that may couple via bolting to terminals on the pull-out fusible switch 242. Likewise, in the depicted embodiment, each of the A, B, and C phase riser bus bars 254, 255, 256 may be supported by and insulated from the enclosure 212 by one or more second insulators 261. Second insulators 261 may also be plastic hex-shaped members, for example.

The pull-out fusible switch 242 contained within the enclosure 212 may be a three-pole fusible switch including an rating of between about 200 A and about 600 A (including 200 A, 400 A, 600 A). The voltage rating may be up to about 600V, or even between about 200V to about 600V. Class T fuses may be used in the Pull-out fusible switch 242, for example. Other types of pull-out fusible switches may be used, such as a two-pole version, including A and B phase fuses, when single phase operation is provided. Pull-out fusible switch 242 may be contained in a lower portion of the enclosure 212, as shown. Other locations for the pull-out fusible switch 242 may be used.

In the meter section 226, the meter sockets 228A-228F may be mounted to the first side 214 and/or the internal wall 223, such as by fasteners (e.g., screws). Power to the line side terminals of the meter sockets 228A-228F may be carried from the A, B, and C phase cross bus bars 248, 249, 250, through the A, B, and C phase connect bus bars 257, 258, 259, through the pull-out fusible switch 242, and through the A, B, and C phase riser bus bars 254, 255, 256. The meter sockets 228A-228F may each include electrical contacts (e.g., clips) adapted to contact meter line side inputs and meter load side outputs and each is adapted to receive and mount a utility meter 243. Any suitable utility meter may be used. In a single phase embodiment of the invention, only A and B phase connect bus bars 257, 258, and only A and B phase riser bus bars 254, 255 would be coupled to the pull-out fusible switch 242, which would be a two-pole pull-out fusible switch.

Now referring to FIGS. 2B, 2C and 2E, a configuration of an embodiment of an interconnection bus connection 264 is shown. Interconnection bus connection 264 may be located between the load side of the pull-out fusible switch 242 and the connection location A on the A, B and C phase riser bus bars 254, 255, 256 where the first meter socket 228A connects. Interconnection bus connection 264 may include A, B, and C phase expansion connections 268A, 268B, 268C to allow attachment of an A phase expansion cross connect bar 270, a B phase expansion cross connect bar 271, and a C phase expansion cross connect bar 272 as is shown in FIG. 3B. The A, B, and C phase expansion connections 268A, 268B, 268C may comprise connection tabs of a conductive metal (e.g., copper or aluminum), such as L-shaped connection tabs, and may be configured to allow bolting of the A phase expansion cross connect bar 270, a B phase cross expansion connect bar 271, and a C Phase expansion cross connect bar 272 to the respective A, B, and C riser bus bars 254, 255, 256 as shown in FIG. 3B.

The interconnection bus connection 264 may include an interconnect shroud 273 that surrounds portions of the A, B, and C phase expansion cross connect bars 270, 271, and 272 as they pass through the tenant section 224. Closure plates 274 may be provided as part of the enclosure 212, and may be removed from the first side 214 and/or second side 216 if an expansion meter stack apparatus 306 is to be added directly adjacent to the meter stack apparatus 206 as is shown in FIG. 3C. Expansion meter stack apparatus 306 may be substantially identical in structure as the meter stack apparatus 206, except that the expansion riser bus bars 354, 355, 356 may be shortened because they do not need to connect directly to a fusible switch. The A, B, and C phase expansion cross connect bars 270, 271, and 272 may be positioned and connect at other vertical locations on the A, B, and C riser bus bars 254, 255, 256.

Figure 3A:
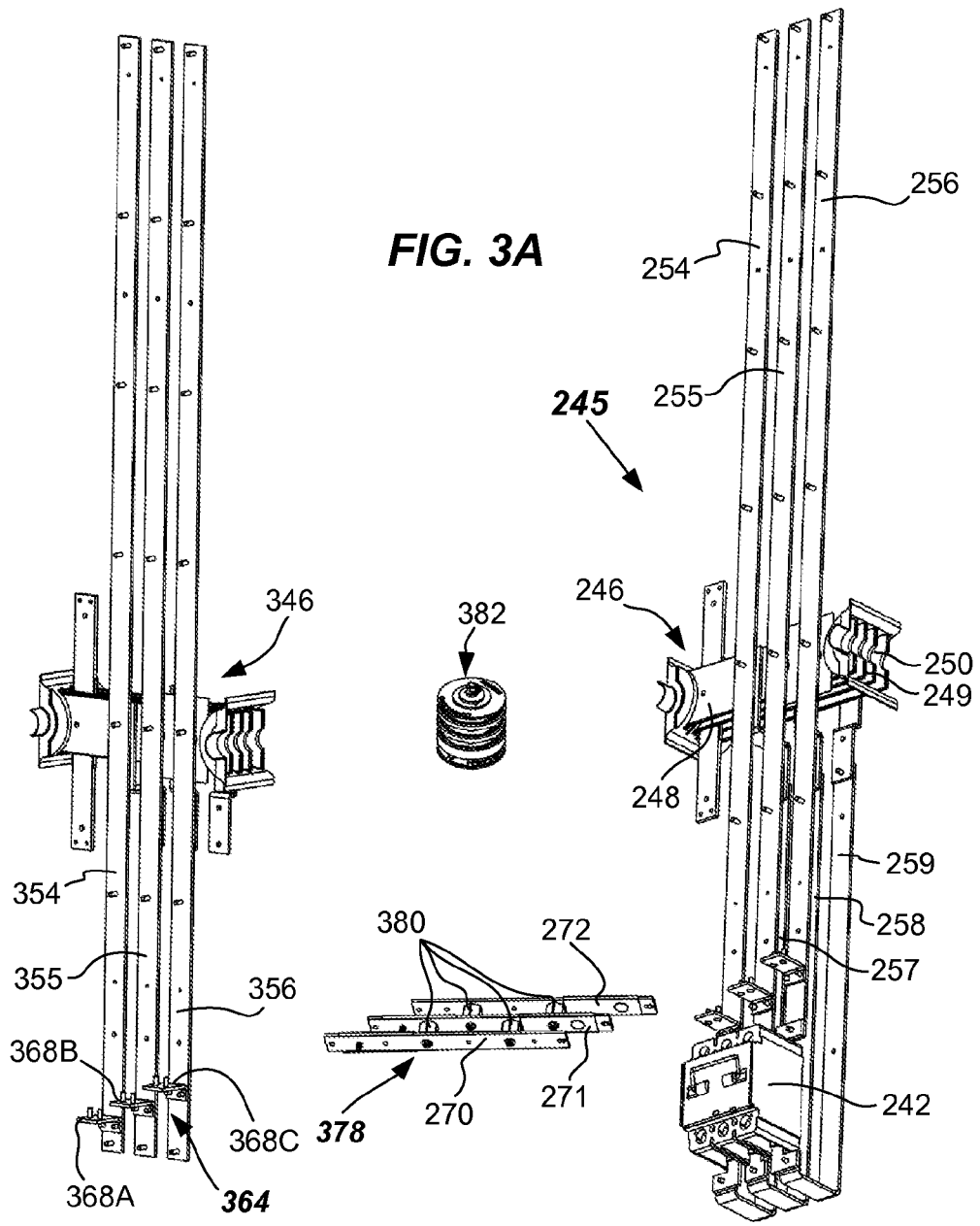
FIG. 3A illustrates an exploded view of components of a bus assembly in a multi-unit power distribution apparatus according to embodiments.
Figure 3B:
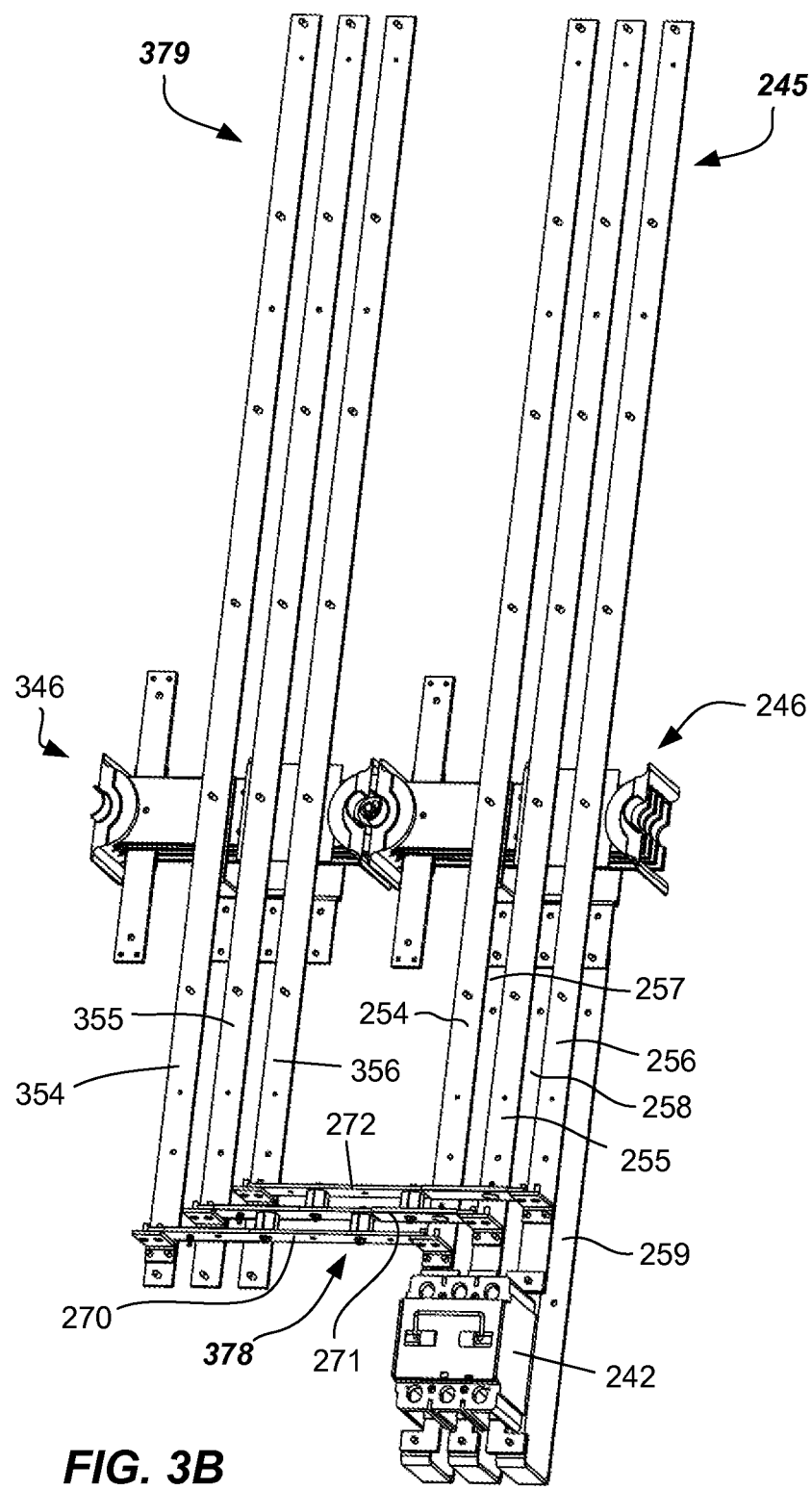
FIG. 3B illustrates a perspective view of a bus assembly according to embodiments.
Figure 3C:
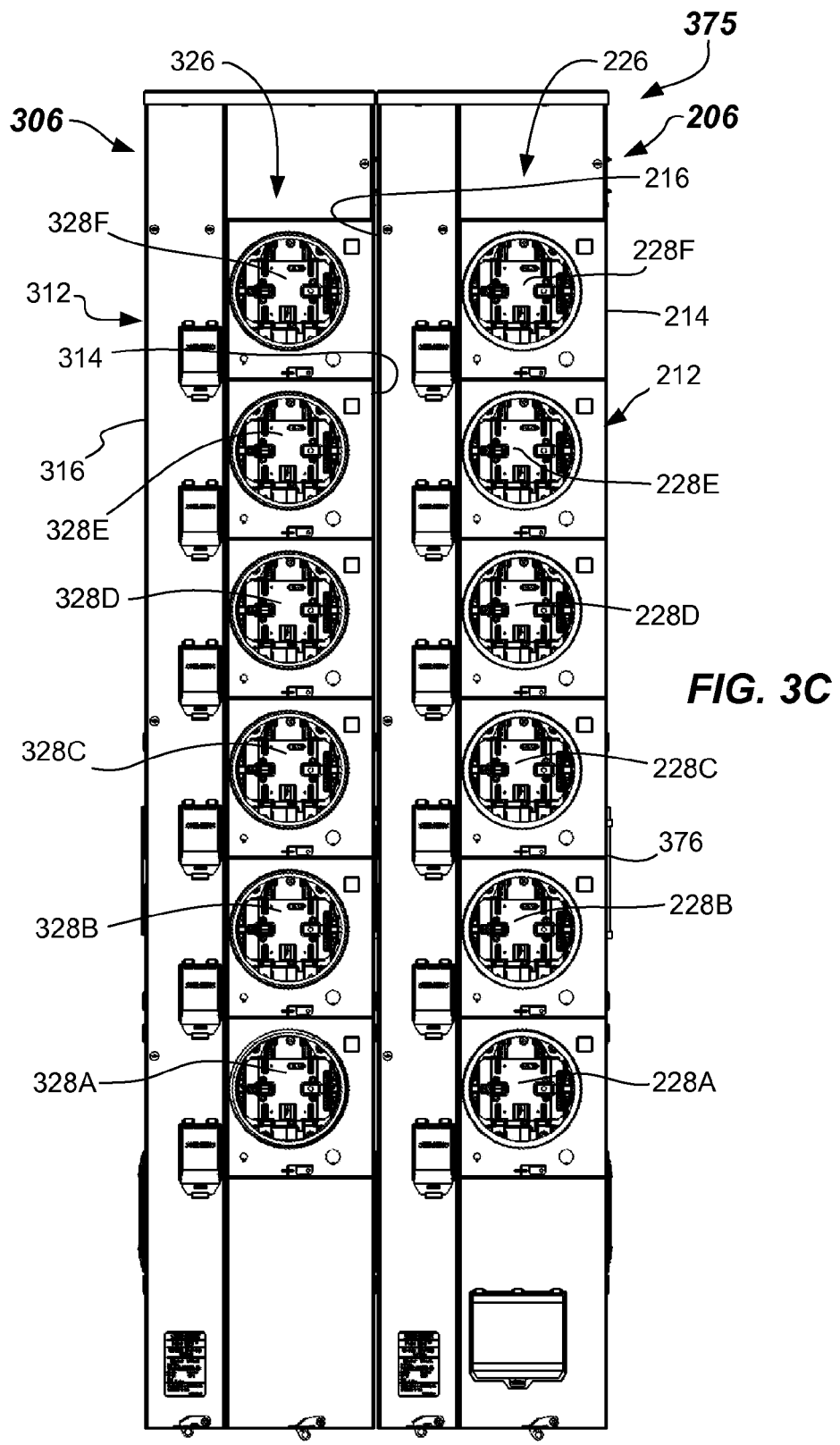
FIG. 3C illustrates a front plan view of a multi-unit power distribution apparatus including a meter stack apparatus and an expansion meter stack apparatus according to embodiments.

Now referring to FIGS. 3A-3C, a multi-unit power distribution apparatus 375 and components thereof are shown. The multi-unit power distribution apparatus 375 includes a meter stack apparatus 206 as previously described, and one or more expansion meter stack apparatus 306 directly abutting the meter stack apparatus 206. The meter stack apparatus 206 includes an enclosure 212 having a first side 214 and a second side 216, and a meter section 226 including a stack of meter sockets 228A-228F configured to receive utility meters 243 (FIG. 2A). The meter stack apparatus 206 includes as shown in FIGS. 3A-3B, a cross bus connection section 246 including A, B, and C phase cross bus bars 248, 249, 250 that extend between the first side 214 and the second side 216. In this embodiment, a side opening on the second side 216 is open and configured to allow electrical connection to the A, B, and C phase cross bus bars 248, 249, 250, whereas the first side 214 includes side cover 376.

The bus and switch assembly 245 of the meter stack apparatus 206 includes the pull-out fusible switch 242 contained within the enclosure, A, B, and C phase riser bus bars 254, 255, 256 coupled to a load side of the pull-out fusible switch 242 and coupled to a line side of the meter sockets 228A-228F, and A, B, and C phase connect bus bars 257, 258, 259 coupled to a line side of the pull-out fusible switch 242, and also to the A, B, C phase cross bus bars 248, 249, 250 of the cross bus connection section 246.

The expansion meter stack apparatus 306 includes an expansion meter stack enclosure 312 having a first mounting side 314 and a second mounting side 316, and expansion meter section 326 including a stack of expansion meter sockets 328A-328F configured to receive expansion utility meters (not shown). Utility meters may be the same as previously described. In the expansion meter stack apparatus 306, an expansion bus assembly 379 including the A, B, and C phase expansion riser bus bars 354, 355, 356 may be coupled to a line side of the expansion meter sockets 328A-328F at multiple locations along a length thereof. Expansion bus assembly 379 may also include an expansion interconnection bus connection 364 including expansion connections 368A, 368B, 368C.

Multi-unit power distribution apparatus 375 may include an interconnection bus assembly 378 coupling the A, B, and C phase riser bus bars 254, 255, 256 and the A, B, and C phase expansion riser bus bars 354, 355, 356. Interconnection bus assembly 378 may include A, B, and C phase cross connect bars 270, 271, 272, which may optionally include insulators (e.g., insulators 380 as shown in FIG. 3A) configured to insulate the A, B, and C phase cross connect bars 270, 271, 272 from one another. Insulators 380 may be a suitable insulating material such as plastic or the like, and may be connected by any suitable means, such as screws. Optionally, the A, B, and C phase cross connect bars 270, 271, 272 may be insulated from each other such as by coating with an insulating material or including an insulating sleeve thereon. The physical arrangement of the expansion bus assembly 379 and bus and switch assembly 245 may be reversed in some embodiments (See FIG. 4A-4B). Embodiments of the invention may be adapted to single phase expansion, wherein the single-phase version would only include A and B cross connect bars 270, 271.

Pass through power may be provided by connecting the cross bus connection section 246 with the expansion cross bus connection section 346. Connection may be by quick connect connector 382, such as a PowerMod™ Quick Connect available from Siemens Corporation. Other numbers of the expansion meter stack apparatus 306 may be provided. For example, two expansion meter stack apparatus 306 may be provided on the left or right side, and additional A, B, and C phase cross connect bars 270, 271, 272 may provide A, B, and C phase power thereto. Additional expansion cross bus connection sections 346 may be provided if more than one expansion meter stack apparatus 306 is provided.

Figure 4A:
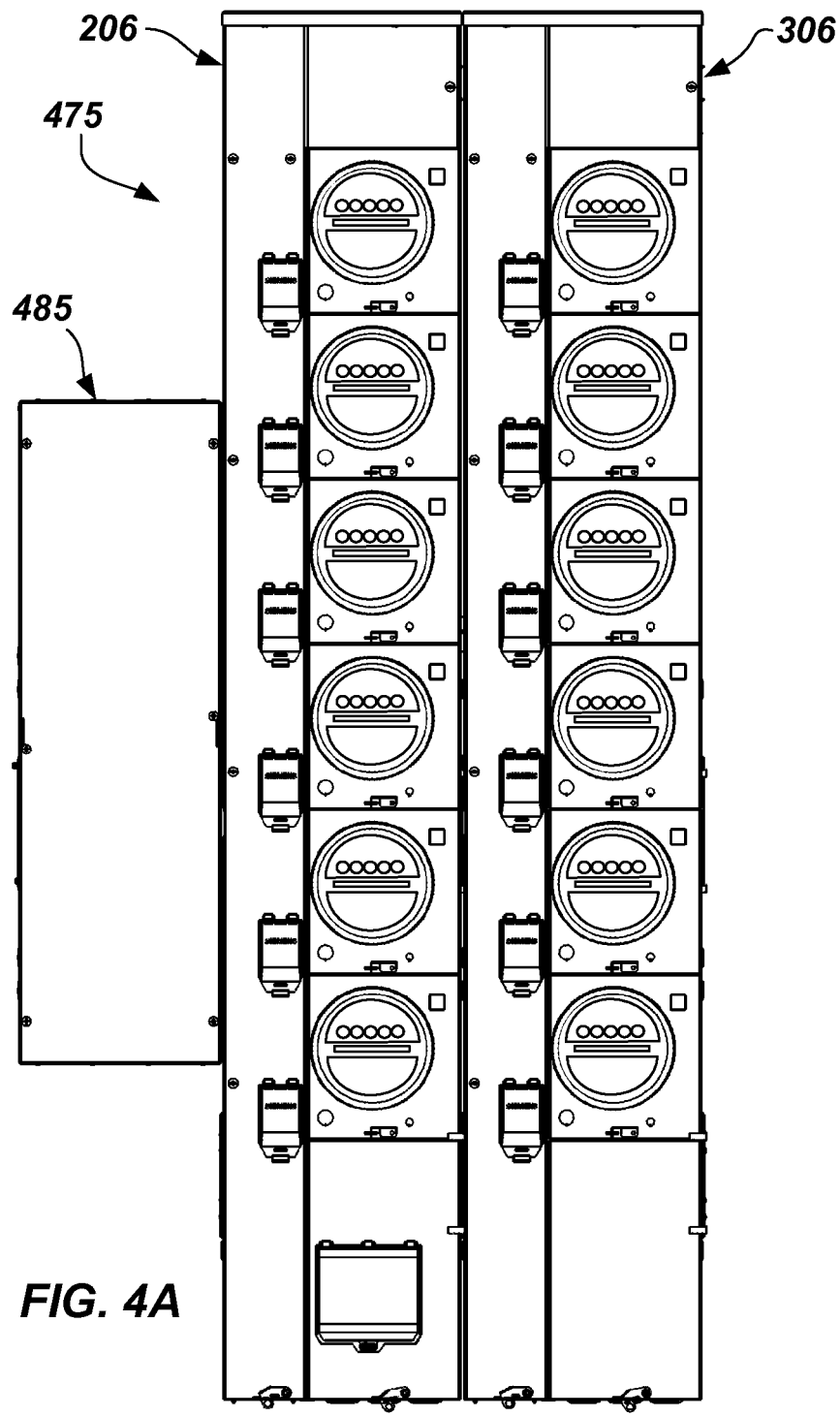
FIG. 4A illustrates a front plan view of a multi-unit power distribution apparatus including a meter stack apparatus and an expansion meter stack apparatus and a tap box according to embodiments.
Figure 4B:
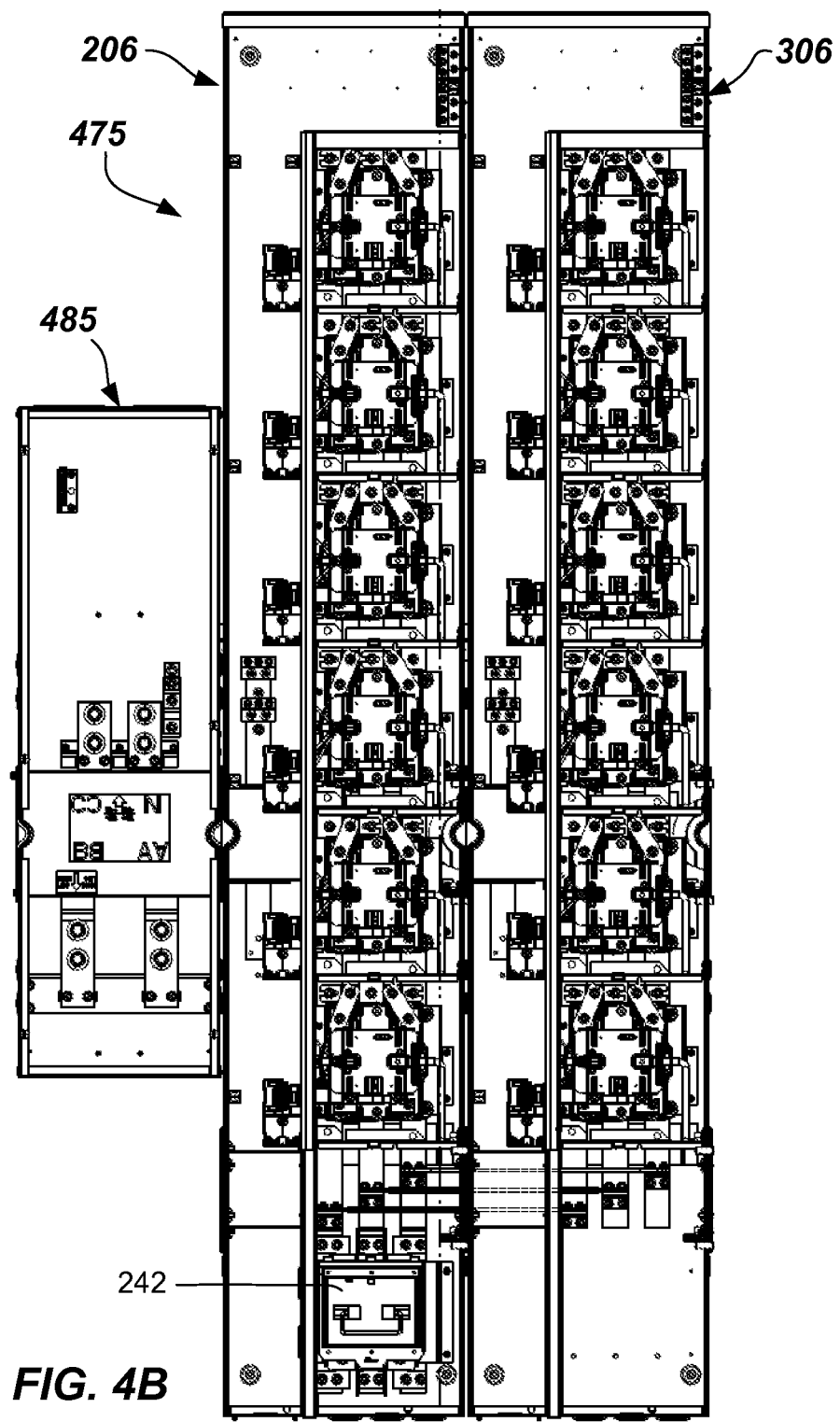
FIG. 4B illustrates a front plan view of a multi-unit power distribution apparatus including a meter stack apparatus and an expansion meter stack apparatus and a tap box with the front covers removed according to embodiments.

FIGS. 4A-4B illustrates a multi-unit power distribution apparatus 475 including a meter stack apparatus 206 as previously described, and an expansion meter stack apparatus 306 directly abutting the meter stack apparatus 206. The expansion meter stack apparatus 306 and meter stack apparatus 206 are reversed from the FIGS. 3A-3C embodiment. Meter stack apparatus 206 coupled directly to a tap box 485 including A, B, C phase and neutral (N) connections. As can be seen, protection for the meter stack apparatus 206 and the expansion meter stack apparatus 306 is provided by including the pull-out fusible switch 242.

Figure 5:
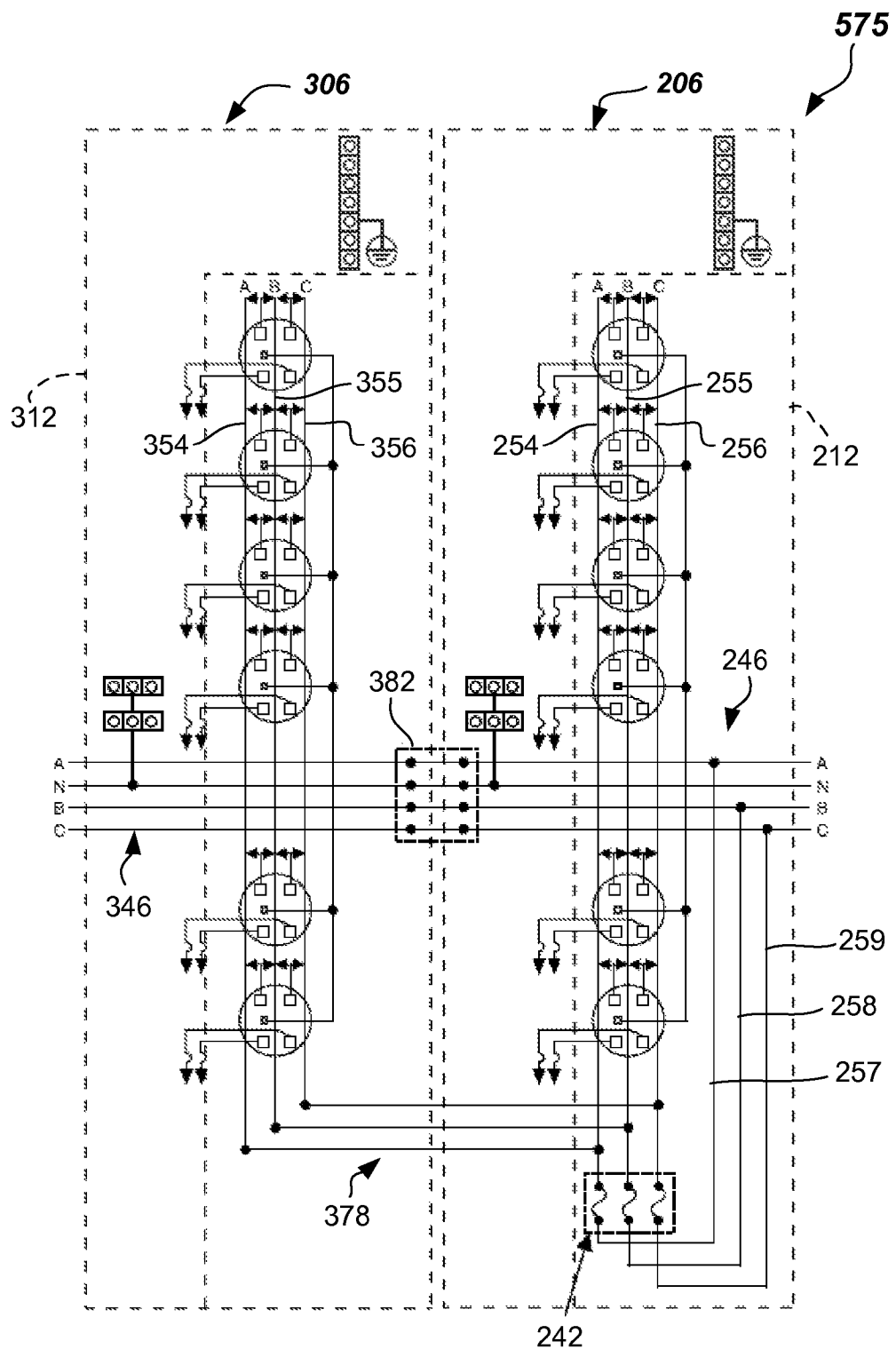
FIG. 5 illustrates a schematic electrical diagram of a meter stack apparatus coupled to an expansion meter stack apparatus according to embodiments.
Figure 6:
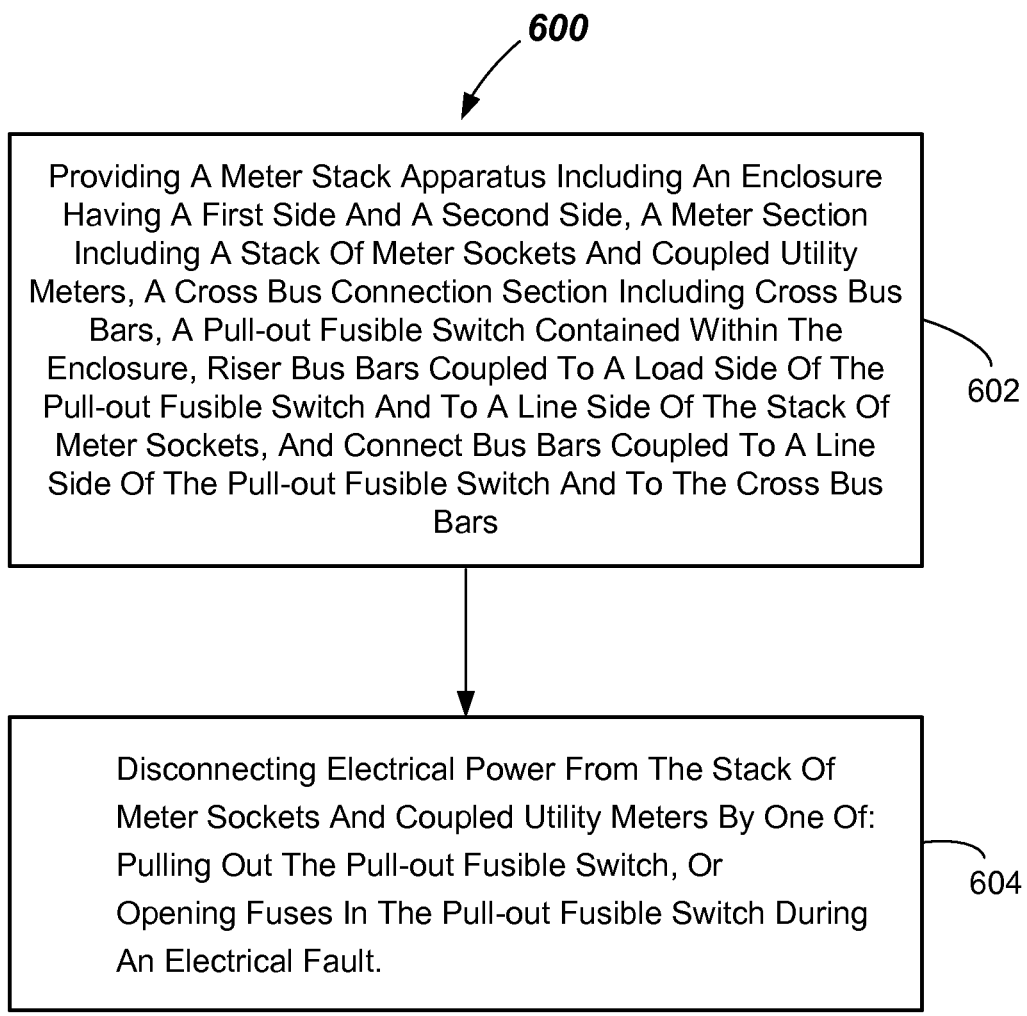
FIG. 6 is a flowchart of a method of operating a meter stack apparatus according to embodiments.

FIG. 5 illustrates an electrical circuit diagram of a multi-unit power distribution apparatus 575 including the expansion meter stack apparatus 306 and meter stack apparatus 206 as previously described according to embodiments. As should be appreciated from the forgoing, an expansion meter stack apparatus 306 may be attached onto one side of the meter stack apparatus 206, which may be attached to other types of panel apparatus, such as a tap box.

In another aspect, a method 600 of operating a meter stack apparatus (e.g., meter stack apparatus 206) is provided. The method 600 includes, in 602, providing a meter stack apparatus including an enclosure (e.g., enclosure 212) having a first side (e.g., first side 214) and a second side (e.g., second side 216), a meter section (e.g., meter section 226) including a stack of meter sockets (e.g., meter sockets 228A-228F) and coupled utility meters (e.g., utility meters 243), a cross bus connection section (e.g., cross bus connection section 246) including cross bus bars (e.g., A phase cross bus bar 248, B phase cross bus bar 249, and C phase cross bus bar 250), a pull-out fusible switch (e.g., pull-out fusible switch 242) contained within the enclosure, riser bus bars (e.g., A phase riser bus bar 254, B phase riser bus bar 255, and C phase riser bus bar 256) coupled to a load side of the pull-out fusible switch and to a line side of the stack of meter sockets, and connect bus bars (e.g., A phase connect bus bar 257, B phase connect bus bar 258, and C phase connect bus bar 259) coupled to a line side of the pull-out fusible switch and to the cross bus bars.

The method 600 includes, in 604, disconnecting electrical power from the stack of meter sockets and coupled utility meters by one of: pulling out the pull-out fusible switch, or opening fuses in the pull-out fusible switch during an overload or electrical fault. A user may pull out the pull-out fusible switch 242 to disconnect power to the utility meters 243, and also to any connected expansion meter stack apparatus 306. Otherwise, the power may be disconnected by destruction (fusing) of the fuses in the Pull-out Fusible Switch 242 during an overload or electrical fault which operates to open (destroy) the fuses in the pull-out fusible switch.

It should be readily appreciated by those persons of ordinary skill in the art that the present invention is susceptible of broad utility and application. Many embodiments and adaptations of the present invention other than those herein described, as well as many variations, modifications, and equivalent arrangements, will be apparent from, or reasonably suggested by, the present invention and the foregoing description thereof, without departing from the substance or scope of the present invention. Accordingly, while the present invention has been described herein in detail in relation to specific embodiments, it is to be understood that this disclosure is only illustrative and presents examples of the present invention and is made merely for purposes of providing a full and enabling disclosure of the invention. This disclosure is not intended to limit the invention to the particular apparatus, systems and/or methods disclosed, but, to the contrary, the intention is to cover all modifications, equivalents, and alternatives falling within the scope of the invention.

What is claimed is:

1. A meter stack apparatus, comprising:
an enclosure having a first side and a second side;
a meter section including a stack of meter sockets to receive utility meters;
a cross bus connection section including cross bus bars extending between the first side and the second side, and having one or more side openings to allow electrical connection to the cross bus bars;
a pull-out fusible switch contained within the enclosure;
riser bus bars coupled to a load side of the pull-out fusible switch and coupled to a line side of the meter sockets; and
connect bus bars directly coupled to a line side of the pull-out fusible switch and to the cross bus bars of the cross bus connection section, wherein the connect bus bars having a lower portion that includes bends that couple via bolting to terminals on the pull-out fusible switch.

2. The meter stack apparatus of claim 1, wherein the cross bus connection
section includes A, B, and C phase cross bus bars;
the riser bus bars include A, B, and C phase riser bus bars; and
the connect bus bars include A, B, and C phase connect bus bars.

3. The meter stack apparatus of claim 1, wherein the cross bus connection section is located between a back side of the enclosure and the riser bus bars.

4. The meter stack apparatus of claim 1, wherein the pull-out fusible switch is contained in a lower portion of the enclosure.

5. The meter stack apparatus of claim 1, comprising an interconnection bus connection on the riser bus bars.

6. The meter stack apparatus of claim 5, wherein the interconnection bus connection is located between the load side of the pull-out fusible switch and a connection location on the riser bus bars to a first meter socket.

7. The meter stack apparatus of claim 5, wherein the interconnection bus connection comprises at least A and B phase expansion connections to allow attachment ment of at least:
an A phase expansion cross connect bar, and
a B phase expansion cross connect bar.

8. The meter stack apparatus of claim 7, wherein the at least A and B phase expansion connections comprise connection tabs.

9. The meter stack apparatus of claim 5, comprising an interconnect shroud.

10. The meter stack apparatus of claim 1, wherein the pull-out fusible switch comprises a rating of between about 200 A and about 600 A.

11. The meter stack apparatus of claim 1, wherein the cross bus connection section includes A and B phase cross bus bars and a neutral cross bus bar;
the riser bus bars include A and B phase riser bus bars; and
the connect bus bars include A and B phase connect bus bars.

12. The meter stack apparatus of claim 1, wherein the connect bus bars include a J- shaped bent end.

13. A multi-unit power distribution apparatus, comprising:
a meter stack apparatus including:
an enclosure having a first side and a second side,
a meter section including a stack of meter sockets to receive utility meters,
a cross bus connection section including cross bus bars extending between the first side and the second side, and having one or more side openings to allow electrical connection to the cross bus bars,
a pull-out fusible switch contained within the enclosure,
riser bus bars coupled to a load side of the pull-out fusible switch and coupled to a line side of the meter sockets, and
connect bus bars coupled to a line side of the pull-out fusible switch and to the cross bus bars of the cross bus connection section;
an expansion meter stack including:
an expansion meter stack enclosure having a first mounting side and a second mounting side,
an expansion meter section including a stack of expansion meter sockets configured to receive expansion utility meters,
expansion riser bus bars coupled to a line side of the expansion meter sockets; and
an interconnection bus assembly coupling the riser bus bars and the expansion riser bus bars.

14. The multi-unit power distribution apparatus of claim 13, wherein the interconnection bus assembly comprises expansion cross connect bars.

15. The multi-unit power distribution apparatus of claim 14, comprising insulators configured to insulate the expansion cross connect bars from one another.

16. The multi-unit power distribution apparatus of claim 13, wherein the interconnection bus assembly passes through an interconnect shroud.

17. The multi-unit power distribution apparatus of claim 13, comprising a tap box coupled to the meter stack apparatus.

18. The multi-unit power distribution apparatus of claim 13, wherein the cross bus connection section includes A, B, and C phase cross bus bars;

the riser bus bars include A, B, and C phase riser bus bars;

the connect bus bars include A, B, and C phase connect bus bars; and the expansion riser bus bars include A, B, and C phase expansion riser bus bars.

19. A method of operating a meter stack apparatus, comprising:

providing a meter stack apparatus including an enclosure having a first side and a second side, a meter section including a stack of meter sockets and coupled utility meters, a cross bus connection section including cross bus bars, a pull-out fusible switch contained within the enclosure, riser bus bars coupled to a load side of the pull-out fusible switch and to a line side of the stack of meter sockets, and connect bus bars directly coupled to a line side of the pull-out fusible switch and to the cross bus bars, wherein the connect bus bars having a lower portion that includes bends that couple via bolting to terminals on the pull-out fusible switch; and disconnecting electrical power from the stack of meter sockets and coupled utility meters by one of:

pulling out the pull-out fusible switch, or opening fuses in the pull-out fusible switch during an overload or electrical fault.

20. A method of operating a meter stack apparatus of claim 19, comprising:

disconnecting electrical power from an expansion meter stack apparatus coupled to the meter stack apparatus by one of:

pulling out the pull-out fusible switch, or opening fuses in the pull-out fusible switch during an overload or electrical fault.

\* \* \* \* \*